United States Patent [19]
Ramdani et al.

[11] Patent Number: 5,838,707
[45] Date of Patent: Nov. 17, 1998

[54] ULTRAVIOLET/VISIBLE LIGHT EMITTING VERTICAL CAVITY SURFACE EMITTING LASER AND METHOD OF FABRICATION

[75] Inventors: Jamal Ramdani, Gilbert; Michael S. Lebby, Apache Junction; Wenbin Jiang, Phoenix, all of Ariz.

[73] Assignee: Motorola, Inc., Schaumburg, Ill.

[21] Appl. No.: 775,048

[22] Filed: Dec. 27, 1996

[51] Int. Cl.⁶ .............................. H01S 3/19; H01S 3/04; H01S 3/08; H01L 21/20
[52] U.S. Cl. .............................. 372/45; 372/36; 372/96; 438/22
[58] Field of Search ................................. 372/36, 45, 46, 372/50, 92, 96, 99; 438/22; 257/76; 148/33.1

[56] References Cited

U.S. PATENT DOCUMENTS

| | | | |
|---|---|---|---|
| 5,076,860 | 12/1991 | Ohba et al. | 148/33.1 |
| 5,146,465 | 9/1992 | Khan et al. | 372/45 |
| 5,432,808 | 7/1995 | Hatano et al. | 372/45 |
| 5,530,267 | 6/1996 | Brandle, Jr. et al. | 257/76 |
| 5,724,376 | 3/1998 | Kish, Jr. et al. | 372/96 |

OTHER PUBLICATIONS

Nakamura et al, "Candela–class High–Brightness inGaN/AlGaN Double–Heterostructure Blue–Light–Emitting Diodes", APPL. PHYS. LETT., vol. 64, No. 13, pp. 1687–1689.

*Primary Examiner*—John D. Lee
*Assistant Examiner*—Quyen Phan Leung
*Attorney, Agent, or Firm*—Eugene A. Parsons

[57] ABSTRACT

An ultraviolet/blue/green vertical cavity surface emitting laser (VCSEL) for use in high density data storage that includes the fabrication of a VCSEL structure on a metallic single crystal substrate. The metallic single crystal substrate is utilized as a back reflecting mirror that in conjunction with an aluminum gallium nitride/gallium nitride distributed Bragg reflector serves to increase the overall reflectance of the VCSEL device. The metallic substrate is fabricated of a material such as nickel aluminum, thereby achieving an improved lattice match to the included III-nitride materials.

30 Claims, 2 Drawing Sheets

ULTRAVIOLET/VISIBLE LIGHT EMITTING VERTICAL CAVITY SURFACE EMITTING LASER AND METHOD OF FABRICATION

FIELD OF THE INVENTION

The present invention pertains to semiconductor lasers, and, more particularly, to vertical cavity surface emitting lasers.

BACKGROUND OF THE INVENTION

At present, conventional edge emitting semiconductor lasers play a significant role in optical communication due to their high operating efficiency and modulation capabilities, however, edge emitting semiconductor lasers have several short comings or problems, thus making them difficult to use in several applications.

Recently, there has been an increased interest in vertical cavity surface emitting lasers (VCSELs). The conventional VCSEL has several advantages, such as emitting light perpendicular to the surface of the die, and the possibility of fabrication of two dimensional arrays. However, while conventional VCSELs have several advantages, they also have several disadvantages with regard to emission in the visible spectrum primarily due to the poor reflectivity of the distributed Bragg reflectors which are contained as a part of the VCSEL structure. Because of this, manufacturability of VCSELs for the visible spectrum is severely limited.

Short wavelength ultraviolet/blue/green laser diodes are of great interest for high density optical data storage, medical applications, etc. With the emergence of digital video disk (DVD) technology which utilizes visible wavelength semiconductor lasers for data storage, the market demand for both 635 nm and 650 nm semiconductor lasers is expected to soon catch up with the demand for the now common 780 nm compact disk (CD) lasers. Of particular interest is the increased storage capacity with the DVD. Specifically, the DVD standard has increased the data storage capacity from 650 Mb, that of standard CD, to 4.7 Gb on a single sided DVD of approximately 12 cm in diameter. This storage capacity increase is attributed more to the tightening of system margins than to the shortening of laser wavelengths from 780 nm to 635 nm or 650 nm. Since the present DVD standard has squeezed the system margin to the minimum, the future generation of DVD technology has to rely mostly on laser wavelength shortening to expand the storage capacity in order to maintain the same disk size. Accordingly, gallium nitride based photonic devices have seen a lot development in last few years. High brightness gallium nitride based blue LEDs have been successfully completed, but continuous wave (CW) laser diodes in the UV/blue range have yet to be achieved. Typically, gallium nitride is grown on sapphire substrate which is very difficult to cleave in order to make a facet mirror, although CW edge emitting purple lasers have recently been successful demonstrated. However, III-nitride VCSELs using gallium nitride/aluminum gallium nitride distributed Bragg reflectors (DBRs) cannot be fabricated because of the low refractive index difference.

Thus, there is a need for developing an ultraviolet/blue/green vertical cavity surface emitting laser (VCSEL) for use in high density DVD technologies.

Accordingly, it is highly desirable to provide for an ultraviolet/blue/green vertical cavity surface emitting laser (VCSEL) for use in high density DVD technologies that includes the fabrication of a VCSEL structure on a metallic single crystal substrate, the metallic single crystal substrate being utilized as a back reflecting mirror that in conjunction with an aluminum gallium nitride/ gallium nitride distributed Bragg reflector serves to increase the overall reflectivity of the VCSEL device mirror to between ninety and one hundred percent, more particularly to greater than ninety-nine percent.

It is a purpose of the present invention to provide a new and improved vertical cavity surface emitting laser (VCSEL) that utilizes a metallic substrate, such as a nickel aluminum (NiAl) substrate, thereby achieving a better lattice match to the epitaxial gallium nitride (GaN) materials.

It is a further purpose of the present invention to provide for a vertical cavity surface emitting laser that includes a metallic substrate, such as a nickel aluminum substrate, as part of a highly reflective mirror included within the VCSEL device.

It is a further purpose of the present invention to provide for a new and improved vertical cavity surface emitting laser (VCSEL) which will result in less dislocation density and continuous wave (CW) operation.

It is a still further purpose of the present invention to provide for a new and improved vertical cavity surface emitting laser that is capable of emission in the ultraviolet/blue/green visible spectrum.

SUMMARY OF THE INVENTION

The above problems and others are substantially solved and the above purposes and others are realized in a vertical cavity surface emitting laser including a metallic supporting substrate having a surface. A first buffer layer is disposed on the surface of the metallic supporting substrate. A first distributed Bragg reflector is disposed on the first buffer layer. The first distributed Bragg reflector is capable of additionally serving as a second buffer layer, and includes pairs of alternating layers. The pairs of alternating layers are positioned adjacent the first buffer layer. A first contact layer is disposed on the first distributed Bragg reflector. A first cladding region is disposed on the first contact layer. An active region is disposed on the first cladding region. A second cladding region is disposed on the active region, a second contact layer is disposed on the second cladding region, and a second distributed Bragg reflector is disposed on the second contact layer.

BRIEF DESCRIPTION OF THE DRAWINGS

The novel features believed characteristic of the invention are set forth in the claims. The invention itself, however, as well as other features and advantages thereof will be best understood by reference to detailed descriptions which follow, when read in conjunction with the accompanying drawings, wherein:

DETAILED DESCRIPTION OF THE PREFERRED EMBODIMENT

Figure 1:
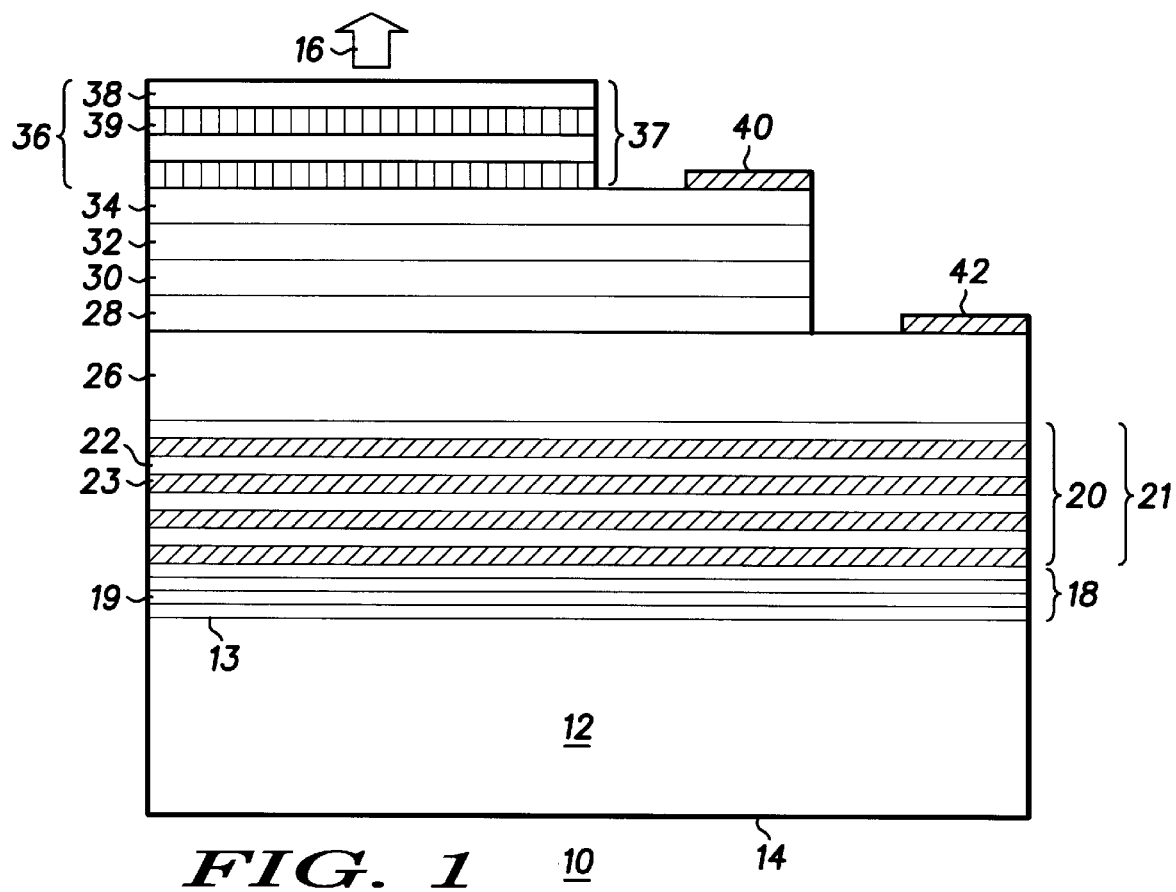
FIG. 1 is an enlarged simplified cross-sectional view of a VCSEL device prepared on a metallic supporting substrate in accordance with the present invention.

During the course of this description, like numbers are used to identify like elements according to the different figures that illustrate the invention. Referring now to FIG. 1 illustrated is a simplified enlarged vertical cavity surface emitting laser (VCSEL) 10 formed on a metallic supporting substrate 12 having surfaces 13 and 14 with light 16 being emitted by VCSEL 10. It should be understood that while FIG. 1 only illustrates a portion of a single VCSEL 10, VCSEL 10 may represent many VCSELs that are located on substrate 12 to form arrays. Generally, VCSEL 10 is made of several defined areas or regions, such as a buffer layer 18, having a plurality of layers 19 of an aluminum nitride material, a first distributed Bragg reflector 20 having a plurality of alternating layers 21 illustrated by layers 22 and 23, a first contact layer 26, a first cladding region 28, an active region 30, a second cladding region 32, a second contact layer 34, and a second distributed Bragg reflector 36 having a plurality of alternating layers 37 illustrated by layers 38 and 39.

Substrate 12, in this example, is made of a metallic material, thereby having inherently formed therein reflective properties. More particularly, in this particular example, metallic supporting substrate 12 is utilized to grow a VCSEL structure and to be used as a back reflecting mirror. In addition, metallic supporting substrate 12 is conductive and in an alternative embodiment serves as an electrode. In a preferred embodiment, metallic supporting substrate 12 is composed of nickel aluminum (NiAl) having between an eight to twelve percent lattice mismatch, more specifically a ten percent lattice mismatch, to gallium nitride. Nickel aluminum is generally preferred in the VCSEL fabrication of the present invention in that it is highly reflective with a surface roughness of less than 15 Å.

In order to dispose high quality gallium nitride materials on metallic supporting substrate 12, more particularly the nickel aluminum supporting substrate, it is very critical to initiate a two dimensional coverage or growth at the nickel aluminum surface 13. Accordingly, as illustrated in detail in FIG. 2, in an enlarged simplified cross-sectional view, a buffer layer 18, composed of a layer by layer growth of aluminum nitride is utilized. During fabrication a first atomic layer of aluminum is deposited, followed by a nitrogenization process to complete one full atomic layer 19 of aluminum nitride. This sequence is repeated until a desired number of layers 19 of aluminum nitride are achieved. Buffer layer 18 serves to facilitate epitaxial growth of subsequent multiple layers that comprise VCSEL 10.

As illustrated in FIG. 1, a distributed Bragg reflector 20 is epitaxially grown on buffer layer 18. Typically, any suitable epitaxial deposition method, such as molecular beam epitaxy (MBE), metal organic chemical vapor deposition (MOCVD), or the like is used to deposit the required multiple layered structures, such as distributed Bragg reflector 20, having the plurality of alternating layers 22 and 23, first contact layer 26, first cladding region 28, active region 30, second cladding region 32, second contact layer 34, and second distributed Bragg reflector 36 for VCSEL 10. Also, it should be understood that many of these layers are made of compound materials, such as n-doped aluminum gallium nitride, n-doped gallium nitride, and indium gallium nitride. It should be understood that epitaxial deposition is used extensively to produce the multitude of layers that comprise the VCSEL 10.

Generally, thicknesses of the plurality of alternating layers 21, the plurality of alternating layers 37, first contact layer 26, second contact layer 34, first cladding region 28, second cladding region 32, and active region 30 are set out as portions of a wavelength of light 16 being emitted by VCSEL 10. It should be understood that the thickness and doping level of each layer must be precisely controlled. Any slight deviation to the designed parameters may affect the VCSEL performance, which will end up affecting the final manufacturing yield. For example, with VCSEL 10 being designed to emit light 16 in the range of 350–550 nm, the optical thickness of each alternating layer 38, and 39 is one quarter of the wavelength of light 16 being emitted from VCSEL 10. In general, each distributed Bragg reflector layer, more specifically layers 22, 23, 38 and 39 has an optical thickness equivalent to a quarter of the designed lasing wavelength.

Doping of VCSEL 10 is achieved by the addition of dopant materials, e.g., n-type dopants and p-type dopants to epitaxial materials used for epitaxial deposition, thereby doping the epitaxially deposited material. While many different dopant concentrations, specific dopant materials, and placement of dopant materials can be used, generally, alternating layers 21 of distributed Bragg reflector 20 are n-type doped with selenium, silicon, or the like to a concentration ranging from 1E15 to 1E20 cm$^3$, with a preferred range from 1E17 to 1E19 cm-$^3$, with a nominal range from 5E17 to 5E18 cm$^3$.

Distributed Bragg reflector 20 is made of the plurality of alternating layers 22 and the plurality of alternating layers 23. By way of example, with substrate 12 being nickel aluminum and buffer layer 18 being aluminum nitride, layer 22 of n-doped aluminum gallium nitride (AlGaN) is epitaxially deposited on surface 13 of substrate 12, with layer 23 of n-doped gallium nitride (GaN) being subsequently epitaxially deposited on layer 22, thereby making a mirror pair or a pair of reflectors (AlGaN/GaN). If additional mirror pairs are required, several more layers, i.e., additional mirror pairs, are deposited on the existing layers 22 and 23.

Generally, alternating layers 21 can have from one pair to twenty pair of mirrors, with a preferred number of pairs ranging from five to ten pairs. Additionally, applicant believes that five mirrored pairs of n-doped aluminum gallium nitride and n-doped gallium nitride give an appropriate reflectivity performance for VCSEL 10 operating in the visible spectrum, in conjunction with metallic supporting substrate 12. However, it should be understood that the number of alternating layers 22 and 23 can be adjusted for specific applications. Also, it should be noted that a top alternating layer is made of n-doped aluminum gallium nitride and forms a top layer for alternating layers 21. It should be understood that highly reflective distributed Bragg reflector mirror 20, in conjunction with metallic supporting substrate 12, is needed to ensure that VCSEL 10 operates effectively. In order to achieve such a high reflectivity, each repetitive layer in the distributed Bragg reflector 20 mirror has to be exactly the same, i.e. one-quarter wavelength for each layer 22 and 23, to retain appropriate constructive interferences among those layers. In general the percent composition of distributed Bragg reflector 20 can be stated as $Al_{(x)}Ga_{1-x}N$/GaN where x is varying from 0.05 to 0.96, and in a preferred embodiment x being greater than 0.8. It should be further understood that in the examples where a percent composition of a particular element is given it should be considered only as an example and that these variations from these examples can be large and are also part of the present invention.

Once the plurality of alternating layers 21 have been deposited on buffer layer 18, a first contact layer 26, more particularly a layer including a highly n-doped gallium nitride material, is epitaxially grown on a top alternating layer 22 of distributed Bragg reflector 20. First contact layer 26 provides an N-metal contact for VCSEL 10 and enhances the reliability of VCSEL 10 by preventing the migration of dislocations and the like to active region 30.

For the sake of simplicity and to prevent overcrowding of the figure, cladding regions 28 and 32 are each shown as a single layer; however, it should be understood that each cladding region 28 and 32 can be made of more than one layer epitaxially disposed or deposited on a previous layer (e.g. first contact layer 26 and active region 30), with cladding regions 28 and 32 being made of any suitable doped or undoped material such as a n-doped and a p-doped aluminum gallium nitride material epitaxially deposited. Also, active region 30 is represented by a single layer which is epitaxially deposited or disposed on cladding region 28; however, it should be understood that active region 30 can include one or more barrier layers and quantum wells, etc., more particularly a first barrier layer and a second barrier layer with a quantum well layer positioned between the first barrier layer and the second barrier layer. Active region 30 further includes an indium gallium nitride material. Next, a second contact layer 34, more particularly a layer of a highly p-doped gallium nitride material is epitaxially grown on second cladding region 32. Second contact layer 34 provides a P-metal contact for VCSEL 10.

A second distributed Bragg reflector 36 is made of the plurality of alternating layers 37. The plurality of alternating layers 37 include one or more layers of a zinc oxide material, illustrated by a layer 38, and one or more layers of an aluminum oxide material, illustrated by a layer 39. By way of example, a layer of zinc oxide (ZnO) is epitaxially deposited on second contact layer 34, with a layer of aluminum oxide ($Al_2O_3$) being subsequently epitaxially deposited on the layer of zinc oxide, thereby making another mirror pair or another pair of reflectors (ZnO/$Al_2O_3$). If additional mirror pairs are required, several more layers, i.e., additional mirror pairs are deposited on the existing layers of zinc oxide and aluminum oxide. It should be understood that second distributed Bragg reflector 36 serves as a dielectric mirror structure.

Generally, the plurality of alternating layers 37 of second distributed Bragg reflector 36 are from one pair to ten mirror pairs, with a preferred number of mirror pairs ranging from four to five pairs. However, it should be understood that the number of mirror pairs can be adjusted for specific applications.

A P-metal electrical contact 40 is formed on second contact layer 34 by disposing any suitable conductive material on layer 34, such as indium tin oxide, gold, zinc, platinum, tungsten, platinum, or the like. A N-metal electrical contact 42 is formed on first contact layer 26 by disposing any suitable conductive material on layer 26, such as indium tin oxide, gold, germanium, or the like. It should be understood that depending upon which material selection is made for electrical contacts 40 and 42, the specific method of disposing and patterning of that specific material will change to form first and second contact layers 26 and 34 and the electrical contact.

Figure 2:
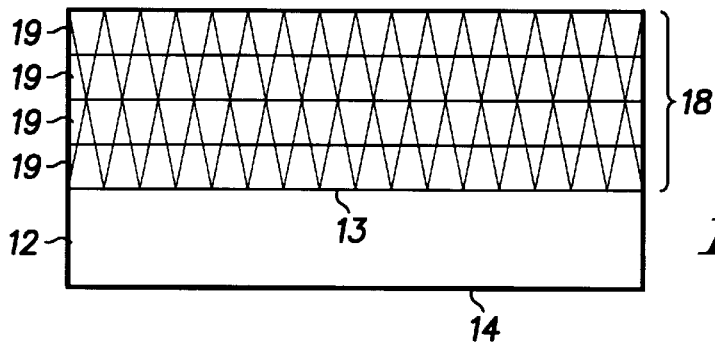
FIG. 2 is an enlarged simplified cross-sectional view of the structure of the buffer layer in accordance with the present invention.
Figure 3:
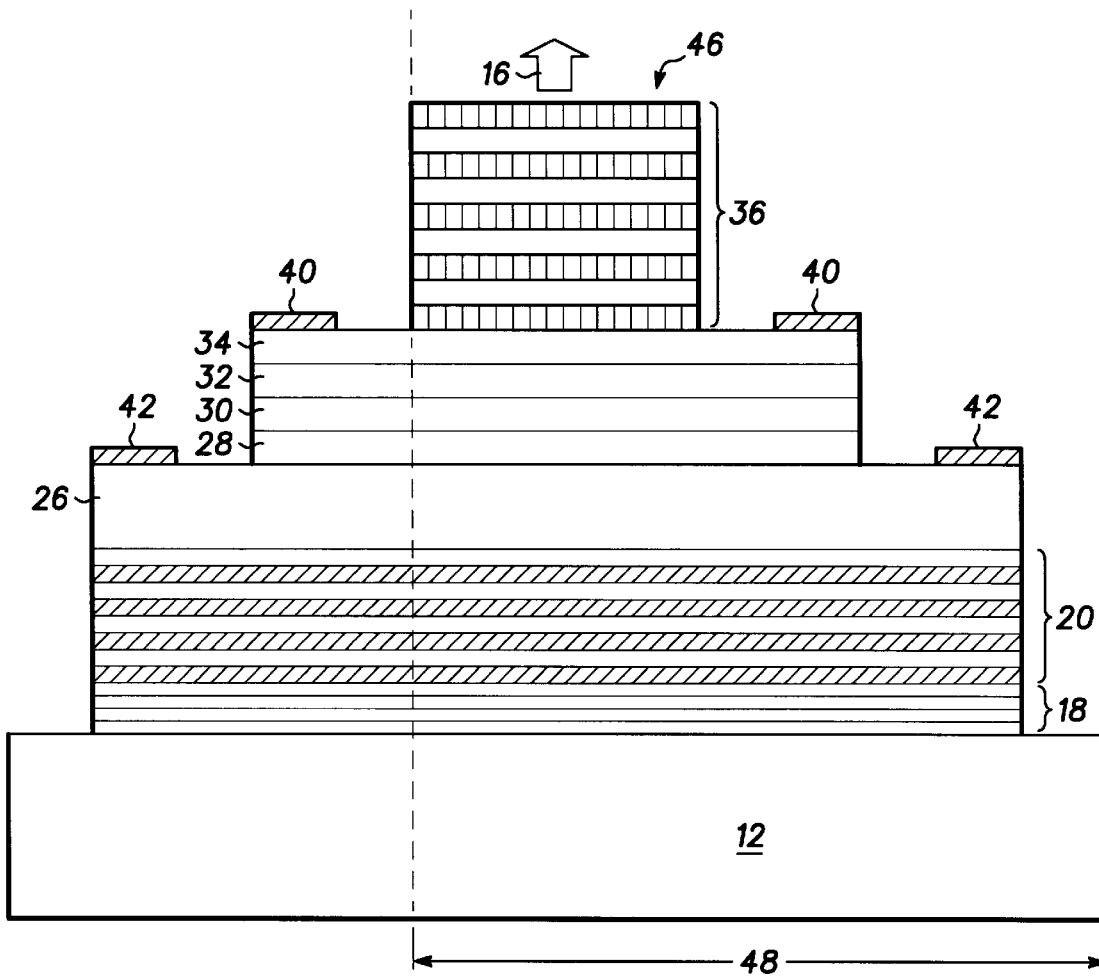
FIG. 3 is an enlarged simplified cross-sectional view of a complete VCSEL device in accordance with the present invention.

Turning now to FIG. 3, illustrated is an enlarged simplified cross-sectional view of a completed VCSEL 10 in accordance with the present invention with some steps in a specific process for the fabrication of VCSEL 10 described. It will of course be understood that other methods might be utilized and the procedure to be described is simply for purposes of example and explanation. Components of the structure in FIG. 3 which are similar to components previously illustrated and described in conjunction with FIGS. 1 and 2 are designated with similar numbers.

Referring specifically to FIG. 3, substrate 12 is illustrated with buffer layer 18 disposed thereon. Next, first distributed Bragg reflector 20 is deposited thereon buffer layer 18. First contact layer 26, first cladding region 28, active region 30, second cladding region 32, and second contact layer 34 are deposited on the upper surface of distributed Bragg reflector 20 as previously described. Distributed Bragg reflector 36 is deposited on the upper surface of second contact layer 34. Here it should be noted that second contact layer 34, second cladding region 32 active region 30 and first cladding region 28 are etched to define VCSEL 10 but the diameter is still substantially larger than a laser emission aperture 46 and the operating cavity region, so that active region 30 will not be damaged by this etching step. Alternatively, proton implantation can be utilized for current isolation with the implantation mask slightly larger than the designed laser emission aperture 46.

Once the above described etching or implantation step is completed P-metal contact 40 is deposited on second contact layer 34, leaving laser emission aperture 46 open. Next, a N-metal contact 42 is deposited onto first contact layer 26, or in the alternative onto surface 14 of metallic supporting substrate 12. Second distributed Bragg reflector 36, more specifically the dielectric mirror structure, is deposited onto second contact layer 34. Broken lines 48 are included in the structure of FIG. 3, to define the portion of FIG. 3 which is illustrated in FIG. 1. It will of course be understood by those skilled in the art that in some applications the structure illustrated in FIG. 1 may be the entire structure and other fabrication methods may be utilized. In this specific embodiment, VCSEL 10 is a top emitting laser so that second distributed Bragg reflector 36 is formed to define emitting window or aperture 46 therethrough. It should be understood that many other types of electrical contacts may be utilized and the present structure is illustrated only for purposes of explanation.

Accordingly, disclosed is a visible emitting vertical cavity surface emitting laser device and method of fabrication. The device of the present invention is fabricated on a metallic supporting substrate that provides for an approximate ten percent lattice mismatch with the included gallium nitride materials. In addition, the metallic supporting substrate, in conjunction with the aluminum gallium nitride/gallium nitride distributed Bragg reflector provides for an approximate ninety-nine percent reflectivity. The device as disclosed is designed to emit laser light in the ultraviolet/blue/green range.

The various steps of the method disclosed have been performed in a specific order for purposes of explanation, however, it should be understood that various steps of the disclosed method may be interchanged and/or combined with other steps in specific applications and it is fully intended that all such changes in the disclosed methods come within the scope of the claims.

While we have shown and described specific embodiments of the present invention, further modifications and improvement will occur to those skilled in the art. We desire it to be understood, therefore, that this invention is not limited to the particular forms shown and we intend in the appended claims to cover all modifications that do not depart from the spirit and scope of this invention.

What is claimed is:

1. A vertical cavity surface emitting laser comprising:

a metallic supporting substrate having a surface;

a first buffer layer disposed on the surface of the metallic supporting substrate;

a first distributed Bragg reflector disposed on the first buffer layer, capable of serving as a second buffer layer, the first distributed Bragg reflector including pairs of alternating layers;

a first contact layer disposed on the first distributed Bragg reflector, a first cladding region disposed on the first contact layer, an active region disposed on the first cladding region, a second cladding region disposed on the active region, and a second contact layer disposed on the second cladding region; and a second distributed Bragg reflector disposed on the second contact layer.

2. A vertical cavity surface emitting laser as claimed in claim 1 wherein the metallic supporting substrate is comprised of nickel aluminum.

3. A vertical cavity surface emitting laser as claimed in claim 1 wherein the first buffer layer includes a plurality of layers of an aluminum nitride material.

4. A vertical cavity surface emitting laser as claimed in claim 3 where, in the first buffer layer including a plurality of layers of aluminum nitride, includes a repetitive process of depositing an atomic layer of aluminum on one of the surface of the metallic supporting substrate and the previous layer of aluminum nitride followed by a nitrogenization process.

5. A vertical cavity surface emitting laser as claimed in claim 1 where, in the pairs of alternating layers in the first distributed Bragg reflector, each pair of alternating layers includes a layer containing an n-doped gallium nitride material.

6. A vertical cavity surface emitting laser as claimed in claim 5 where, in the pairs of alternating layers in the first distributed Bragg reflector, each pair of alternating layers includes a layer of an aluminum gallium nitride material.

7. A vertical cavity surface emitting laser as claimed in claim 6 wherein the pairs of alternating layers in the first distributed Bragg reflector includes five to ten pairs of layers.

8. A vertical cavity surface emitting laser as claimed in claim 1 wherein the first contact layer includes a n-doped gallium nitride material.

9. A vertical cavity surface emitting laser as claimed in claim 8 wherein the second contact layer includes a p-doped gallium nitride material.

10. A vertical cavity surface emitting laser as claimed in claim 1 wherein the first cladding region includes a n-doped aluminum gallium nitride material.

11. A vertical cavity surface emitting laser as claimed in claim 10 wherein the second cladding region includes a p-doped aluminum gallium nitride material.

12. A vertical cavity surface emitting laser as claimed in claim 1 wherein the active region defines multiple quantum wells and includes an indium gallium nitride material.

13. A vertical cavity surface emitting laser as claimed in claim 1 wherein the second distributed Bragg reflector includes a dielectric mirror structure.

14. A vertical cavity surface emitting laser as claimed in claim 13 wherein the dielectric mirror structure includes having pairs of alternating layers of a zinc oxide material and an aluminum oxide material.

15. A vertical cavity surface emitting laser as claimed in claim 14 wherein the pairs of alternating layers in the second distributed Bragg reflector includes from one to ten pairs of layers.

16. A vertical cavity surface emitting laser comprising:

a metallic supporting substrate having a surface;

a buffer layer disposed on the surface of the metallic supporting substrate, the buffer layer including a plurality of layers of an aluminum nitride material;

a first distributed Bragg reflector disposed on the surface of the buffer layer, the first distributed Bragg reflector having pairs of alternating layers with a first layer in each pair including a n-doped gallium nitride material and a second layer in each pair including an aluminum gallium nitride material;

a first contact layer disposed on the first distributed Bragg reflector including a n-doped gallium nitride material;

a first cladding region disposed on the first contact layer including a n-doped aluminum gallium nitride material;

an active region disposed on the first cladding region, the active region having a quantum well layer, a first barrier layer and a second barrier layer with the quantum well layer positioned between the first barrier layer and the second barrier layer;

a second cladding region disposed on the active region and including a p-doped aluminum gallium nitride material;

a second contact layer disposed on the second cladding region and including a p-doped gallium nitride material; and a second distributed Bragg reflector disposed on the second contact layer, the second distributed Bragg reflector including pairs of alternating layers with each pair including a layer with a zinc oxide material and a layer with an aluminum oxide material.

17. A vertical cavity surface emitting laser as claimed in claim 16 wherein the metallic supporting substrate is comprised of nickel aluminum.

18. A vertical cavity surface emitting laser as claimed in claim 16 wherein the first distributed Bragg reflector enhances reflectivity to between ninety and one hundred percent.

19. A vertical cavity surface emitting laser as claimed in claim 16 wherein the metallic supporting substrate and the gallium nitride material have a lattice mismatch of twelve percent or less.

20. A method of fabricating a vertical cavity surface emitting laser comprising the steps of:

providing a metallic supporting substrate having a surface;

disposing a buffer layer on the surface of the metallic supporting substrate, forming the buffer layer to include a plurality of layers of an aluminum nitride material;

disposing a first distributed Bragg reflector on the buffer layer, forming the first distributed Bragg reflector to include pairs of alternating layers, and positioning the pairs of alternating layers adjacent the buffer layer;

disposing a first contact layer on the first distributed Bragg reflector, a first cladding region on the first contact layer, an active region on the first cladding region, a second cladding region on the active region and a second contact layer on the second cladding region; and disposing a second distributed Bragg reflector on the second contact layer.

21. A method of fabricating a vertical cavity surface emitting laser as claimed in claim 20 wherein the step of disposing a first distributed Bragg reflector on the buffer layer includes forming each of the pairs of alternating layers with a first layer in each pair to include a n-doped gallium nitride material.

22. A method of fabricating a vertical cavity surface emitting laser as claimed in claim 21 wherein the step of disposing a first distributed Bragg reflector on the buffer layer includes forming each of the pairs of alternating layers with a second layer in each pair to include an aluminum gallium nitride material.

23. A method of fabricating a vertical cavity surface emitting laser as claimed in claim 20 wherein the step of disposing the buffer layer to include a plurality of layers of an aluminum nitride material includes the step of depositing a layer of an aluminum material on the surface of the metallic supporting substrate and nitrogenizing the layer of the aluminum material during the method of fabricating and thereafter repeating the step of depositing a layer of an aluminum material and nitrogenizing the layer of the aluminum material to generate a plurality of layers of an aluminum nitride material.

24. A method of fabricating a vertical cavity surface emitting laser as claimed in claim 20 wherein the step of disposing a first contact layer includes the step of forming the first contact layer to include a n-doped gallium nitride material.

25. A method of fabricating a vertical cavity surface emitting laser as claimed in claim 20 wherein the step of disposing a first cladding region includes the step of forming the first cladding region to include a n-doped aluminum gallium nitride material.

26. A method of fabricating a vertical cavity surface emitting laser as claimed in claim 20 wherein the step of disposing an active region includes the step of forming the active region to define multiple quantum wells and to include an indium gallium nitride material.

27. A method of fabricating a vertical cavity surface emitting laser as claimed in claim 20 wherein the step of disposing a second cladding region includes the step of forming the second cladding region to include a p-doped aluminum gallium nitride material.

28. A method of fabricating a vertical cavity surface emitting laser as claimed in claim 20 wherein the step of disposing a second contact layer includes the step of forming the second contact layer to include a p-doped gallium nitride material.

29. A method of fabricating a vertical cavity surface emitting laser as claimed in claim 20 wherein the step of disposing a second distributed Bragg reflector includes the step of forming the second distributed Bragg reflector to include alternating layers of a zinc oxide material and an aluminum oxide material.

30. A method of fabricating a vertical cavity surface emitting laser comprising the steps of:

providing a nickel aluminum supporting substrate having a surface;

disposing a buffer layer on the surface of the nickel aluminum supporting substrate, forming the buffer layer to include a plurality of layers of an aluminum nitride material;

disposing a first distributed Bragg reflector on the buffer layer, forming the first distributed Bragg reflector to include pairs of alternating layers of a n-doped gallium nitride material and an aluminum gallium nitride material, and positioning the pairs of alternating layers adjacent the buffer layer;

disposing a n-doped gallium nitride contact layer on the first distributed Bragg reflector, a n-doped aluminum gallium nitride cladding layer on the n-doped gallium nitride contact layer, an indium gallium nitride active layer on the n-doped aluminum gallium nitride cladding layer, a p-doped aluminum gallium nitride cladding layer on the indium gallium nitride active layer and a p-doped gallium nitride contact layer on the p-doped aluminum gallium nitride cladding layer; and disposing a second distributed Bragg reflector on the p-doped gallium nitride contact layer, forming the second distributed Bragg reflector to include pairs of alternating layers including a zinc oxide material and an aluminum oxide material, and positioning the pairs of alternating layers adjacent the p-doped gallium nitride contact layer.

* * * * *